US012604541B2

(12) United States Patent　　　　(10) Patent No.: US 12,604,541 B2
Horiguchi et al.　　　　　　　　　(45) Date of Patent: Apr. 14, 2026

(54) PHOTOELECTRIC CONVERSION MODULE, PADDLE, AND METHOD FOR MANUFACTURING PHOTOELECTRIC CONVERSION MODULE

(71) Applicant: IDEMITSU KOSAN CO., LTD., Tokyo (JP)

(72) Inventors: Kyohei Horiguchi, Tokyo (JP); Motoshi Nakamura, Tokyo (JP); Mikio Hamano, Tokyo (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 18/697,072

(22) PCT Filed: Sep. 29, 2022

(86) PCT No.: PCT/JP2022/036606
§ 371 (c)(1),
(2) Date: Mar. 29, 2024

(87) PCT Pub. No.: WO2023/054652
PCT Pub. Date: Apr. 6, 2023

(65) Prior Publication Data
US 2025/0234656 A1　　Jul. 17, 2025

(30) Foreign Application Priority Data
Sep. 30, 2021　(JP) ................................. 2021-162314

(51) Int. Cl.
H10F 19/90　　(2025.01)
H10F 77/50　　(2025.01)
H02S 20/30　　(2014.01)

(52) U.S. Cl.
CPC ........... H10F 19/904 (2025.01); H10F 77/50 (2025.01); H02S 20/30 (2014.12)

(58) Field of Classification Search
None
See application file for complete search history.

(56) References Cited

U.S. PATENT DOCUMENTS

2008/0202584 A1 * 8/2008 Basol ...................... H10F 10/10
　　　　　　　　　　　　　　　　　　257/E27.125
2011/0155209 A1　　6/2011 Tober et al.
(Continued)

FOREIGN PATENT DOCUMENTS

CN　　112563358 A　 *　3/2021
JP　　06-140651　　*　5/1994
(Continued)

OTHER PUBLICATIONS

English machine translation of Atsuta (WO-2014065016-A1) provided by the EPO website, All Pages 2025. (Year: 2025).*
(Continued)

*Primary Examiner* — Daniel P Malley, Jr.
(74) *Attorney, Agent, or Firm* — Foley & Lardner LLP

(57) ABSTRACT

Provided is a photoelectric conversion module capable of suppressing a short circuit between photoelectric conversion elements adjacent to each other. The photoelectric conversion module (100) comprises a first photoelectric conversion element (10a) including a conductive substrate (20a) and a second photoelectric conversion element (10b) including a conductive substrate (20b). The first photoelectric conversion element and the second photoelectric conversion element are arranged side by side so as to partially overlap each other. A part of the conductive substrate of the second photoelectric conversion element is electrically connected to the first photoelectric conversion element. An insulating
(Continued)

material (50*b*) that separates the conductive substrate of the second photoelectric conversion element from the conductive substrate of the first photoelectric conversion element is provided on the conductive substrate (20*b*) of the second photoelectric conversion element.

11 Claims, 9 Drawing Sheets

(56)                    References Cited

U.S. PATENT DOCUMENTS

2017/0125619  A1      5/2017  Nakano et al.
2023/0109458  A1*    4/2023  Fukuda ................. H10F 19/902
                                                                     136/252

FOREIGN PATENT DOCUMENTS

| | | | | |
|---|---|---|---|---|
| JP | H06-140651 | A | 5/1994 | |
| JP | 2010-199173 | A | 9/2010 | |
| JP | 2012-501086 | A | 1/2012 | |
| JP | 2016-119401 | A | 6/2016 | |
| WO | WO-2014065016 | A1 * | 5/2014 | ......... H01L 31/0445 |
| WO | WO-2015/152020 | A1 | 10/2015 | |

OTHER PUBLICATIONS

English machine translation of Fang (CN-112563358-A) provided by the EPO website, All Pages 2025. (Year: 2025).*
International Searching Authority, "International Search Report," issued in connection with International Patent Application No. PCT/JP2022/036606, dated Dec. 20, 2022.
International Searching Authority, "Written Opinion," issued in connection with International Patent Application No. PCT/JP2022/036606, dated Dec. 20, 2022.

* cited by examiner

100

50a, 50b    20a, 20b

Z ⊗ → X

Y

100

10a

31a

31b

10a

10b

10b

32b

PHOTOELECTRIC CONVERSION MODULE, PADDLE, AND METHOD FOR MANUFACTURING PHOTOELECTRIC CONVERSION MODULE

CROSS-REFERENCE TO RELATED APPLICATIONS

The present application claims priority under 35 U.S.C. § 371 to International Patent Application No. PCT/JP2022/036606, filed Sep. 29, 2022, which claims priority to and the benefit of Japanese Patent Application No. 2021-162314, filed on Sep. 30, 2021. The contents of these applications are hereby incorporated by reference in their entireties.

TECHNICAL FIELD

The present invention relates to a photoelectric conversion module, a paddle, and a method for manufacturing a photoelectric conversion module.

BACKGROUND ART

Photoelectric conversion modules that convert light energy into electrical energy are known (Patent Literature 1). The photoelectric conversion module described in Patent Literature 1 includes a plurality of photoelectric conversion elements. End portions of the photoelectric conversion elements adjacent to each other are overlapped with each other. The photoelectric conversion elements adjacent to each other are electrically connected to each other by a conductor such as solder in a region overlapping each other (see FIG. 5 of Patent Literature 1).

In the photoelectric conversion module described in Cited Document 1, in order to suppress occurrence of a short circuit, all side surfaces of the photoelectric conversion element are covered with an insulating cover over the entire circumference.

CITATION LIST

Patent Literature

Patent Literature 1: JP 2016-119401 A

In the photoelectric conversion module described in Patent Literature 1, all side surfaces of the photoelectric conversion element are covered with an insulating cover over the entire circumference. However, the insulating cover is highly likely to protrude from the substrate constituting the photoelectric conversion element, and may contaminate a stage constituting the manufacturing apparatus.

Therefore, a photoelectric conversion module capable of suppressing a short circuit between photoelectric conversion elements adjacent to each other by another method and a method for manufacturing the photoelectric conversion module are desired.

A photoelectric conversion module according to one aspect comprises: a first photoelectric conversion element including a conductive substrate; and a second photoelectric conversion element including a conductive substrate. The first photoelectric conversion element and the second photoelectric conversion element are arranged side by side so as to partially overlap each other. A part of the conductive substrate of the second photoelectric conversion element is electrically connected to the first photoelectric conversion element. An insulating material that separates the conductive substrate of the second photoelectric conversion element from the conductive substrate of the first photoelectric conversion element is provided on the conductive substrate of the second photoelectric conversion element.

A method for manufacturing a photoelectric conversion module comprises: a step of preparing a first photoelectric conversion element including a conductive substrate and a second photoelectric conversion element including a conductive substrate and an insulating material provided on the conductive substrate; and a connecting step of electrically connecting a part of the conductive substrate of the second photoelectric conversion element to the first photoelectric conversion element. The connecting step includes arranging a part of the conductive substrate of the second photoelectric conversion element to be electrically connected to the first photoelectric conversion element while the insulating material separates the conductive substrate of the second photoelectric conversion element from the conductive substrate of the first photoelectric conversion element.

A paddle according to one aspect comprises said photoelectric conversion module.

DESCRIPTION OF EMBODIMENTS

Figure 1:
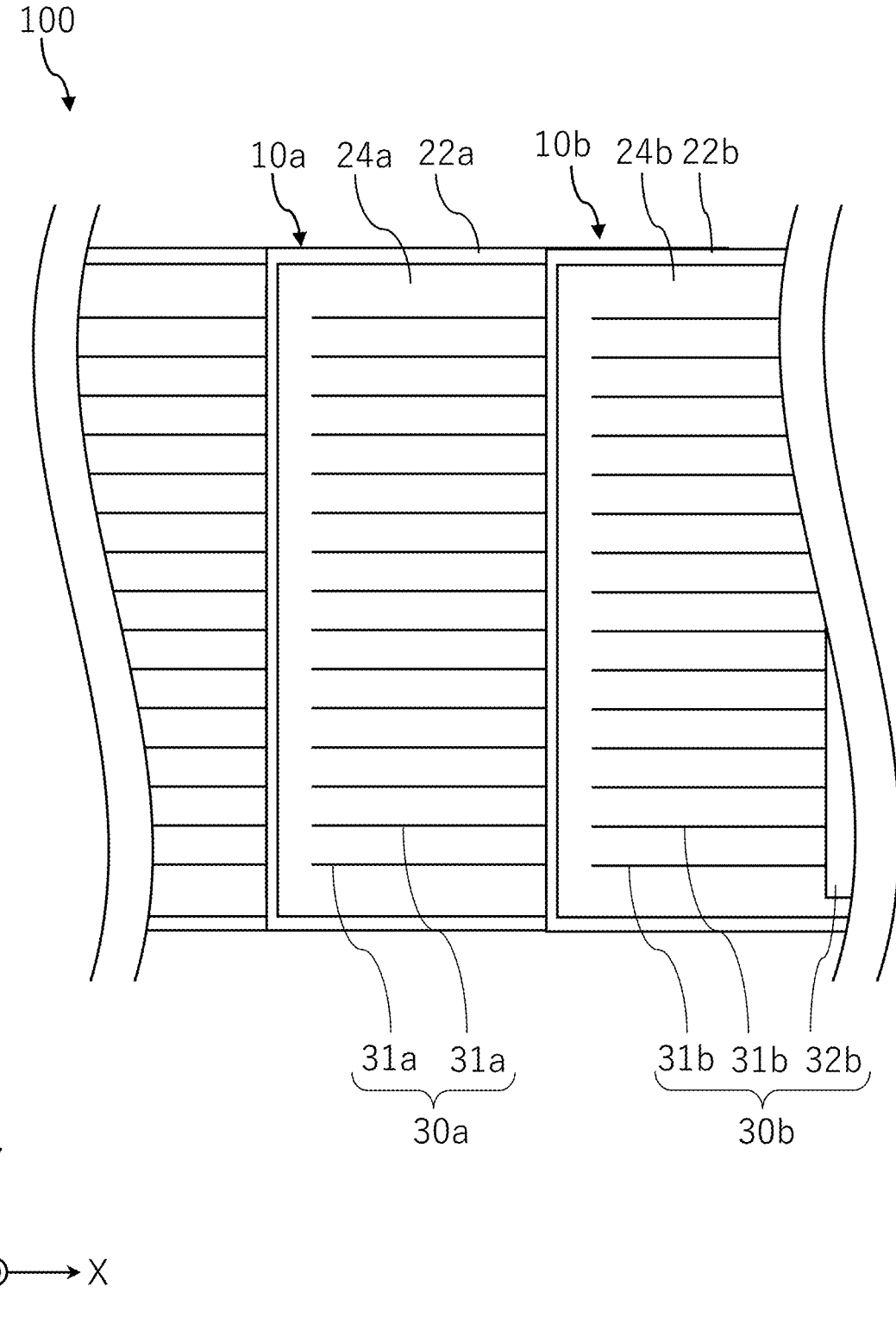
FIG. 1 is a schematic plan view of a photoelectric conversion module according to a first embodiment.

Hereinafter, embodiments will be described with reference to the drawings. In the following drawings, the same or similar parts are denoted by the same or similar reference numerals. However, it should be noted that the drawings are schematic, and ratios of dimensions and the like may be different from actual ones.

First Embodiment

Figure 2:
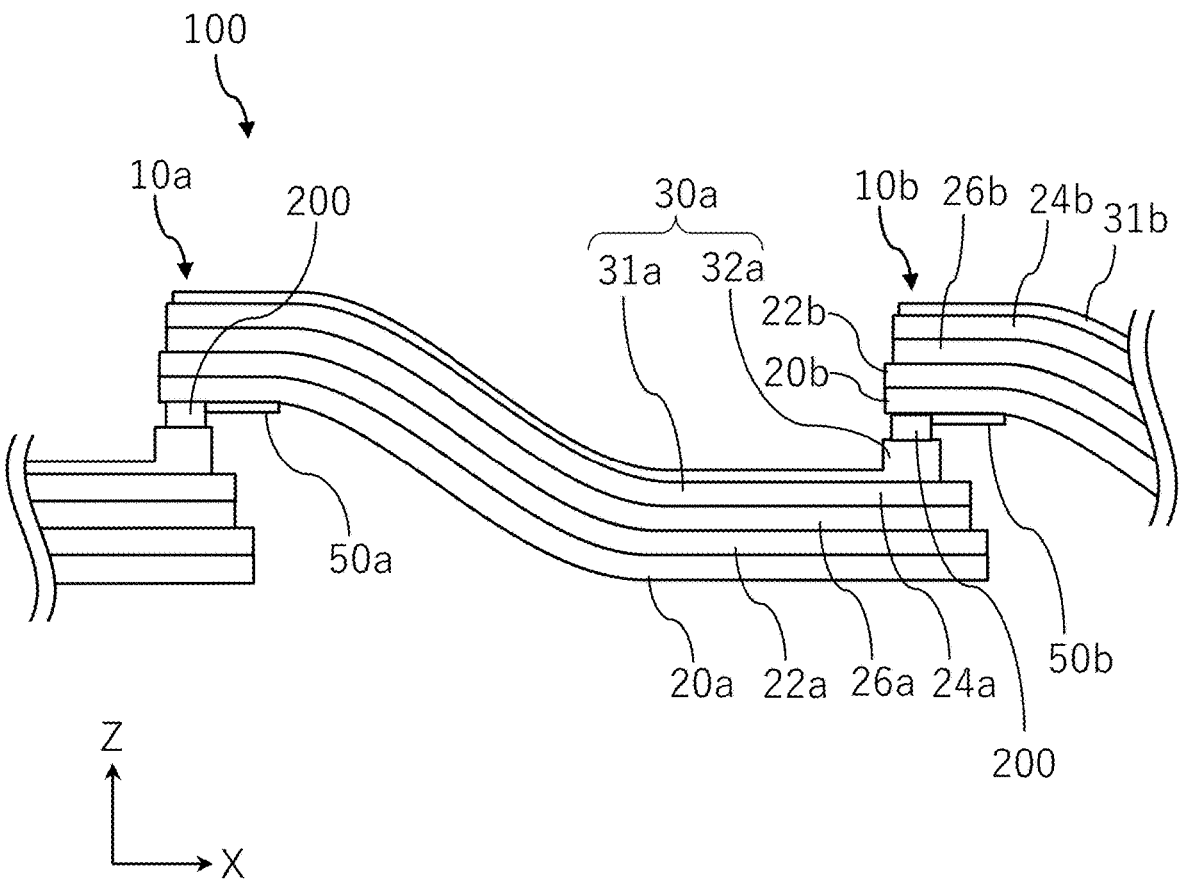
FIG. 2 is a schematic side view of the photoelectric conversion module as viewed from a Y direction in FIG. 1.
Figure 3:
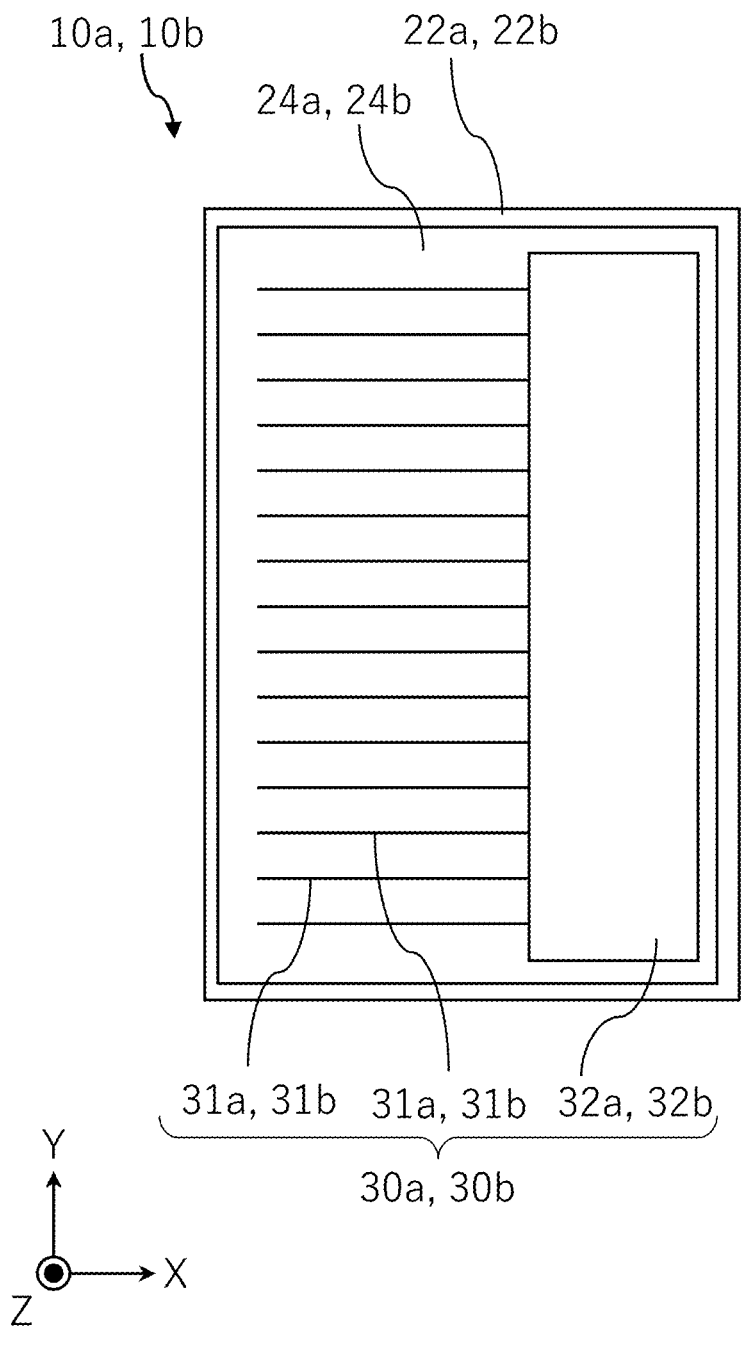
FIG. 3 is a schematic plan view of each photoelectric conversion element constituting the photoelectric conversion module.
Figure 4:
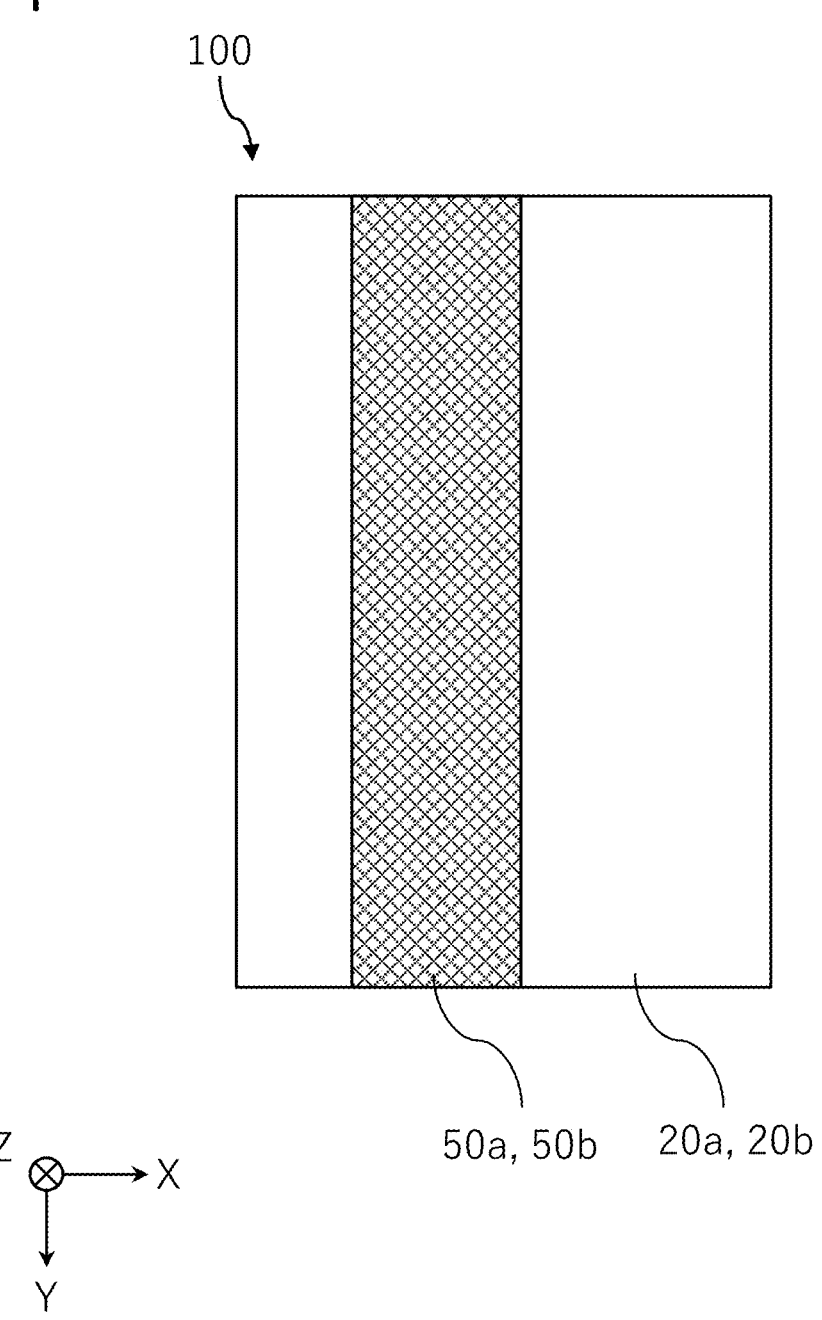
FIG. 4 is a schematic rear view of the photoelectric conversion element illustrated in FIG. 3 as viewed from the opposite side.

FIG. 1 is a schematic plan view of a photoelectric conversion module according to a first embodiment. FIG. 2 is a schematic side view of the photoelectric conversion module as viewed from a Y direction in FIG. 1. FIG. 3 is a schematic plan view of one photoelectric conversion element constituting the photoelectric conversion module. FIG. 4 is a schematic rear view of the photoelectric conversion element illustrated in FIG. 3 as viewed from the opposite side. In FIGS. 3 and 4, in order to describe the structure of each photoelectric conversion element constituting the photoelectric conversion module, it should be noted that reference numerals related to each photoelectric conversion element are given.

A photoelectric conversion module 100 according to the first embodiment includes a plurality of photoelectric conversion elements 10a and 10b, and a conductor 200 that electrically connects the photoelectric conversion elements 10a and 10b adjacent to each other. The plurality of photoelectric conversion elements 10a and 10b is arranged side by side in one direction (X direction in the drawing). The photoelectric conversion elements 10a and 10b adjacent to each other are provided side by side so as to partially overlap each other. Specifically, one end portions of the photoelectric conversion elements 10a and 10b overlap the other end portions of the photoelectric conversion elements 10a and 10b adjacent thereto in a thickness direction. The photoelectric conversion elements 10a and 10b adjacent to each other are electrically connected to each other by the conductor 200 in the overlapping portion. The conductor 200 may be made by a conductive member such as solder or conductive paste. The number of photoelectric conversion elements 10a and 10b arranged in one direction may be at least two, and preferably three or more.

The photoelectric conversion elements 10a and 10b according to the present embodiment may be thin-film photoelectric conversion elements. Preferably, the photoelectric conversion elements 10a and 10b are solar cell elements that convert light energy into electrical energy.

Each of the photoelectric conversion elements 10a and 10b has conductive substrates 20a and 20b serving as bases for forming respective layers such as first electrode layers 22a and 22b described later. The conductive substrates 20a and 20b are constructed by a substrate such as a metal substrate. Further, the conductive substrates 20a and 20b may be flexible substrates. The shapes and dimensions of the conductive substrates 20a and 20b are appropriately determined according to the sizes and the like of the photoelectric conversion elements 10a and 10b.

When a metal substrate is adopted as the conductive substrates 20a and 20b, the conductive substrates 20a and 20b are formed by, for example, titanium (Ti), stainless steel (SUS), copper or aluminum, or an alloy thereof, and so on. Alternatively, the conductive substrates 20a and 20b may have a laminated structure in which a plurality of metal base materials are laminated, and for example, a stainless foil, a titanium foil, or a molybdenum foil may be formed on the surface of the substrate. In order to prevent warpage, a metal material such as molybdenum, titanium, or chromium may be deposited on the back side of the conductive substrates 20a and 20b.

When the conductive substrates 20a and 20b are flexible metal substrates, the photoelectric conversion elements 10a and 10b can be bent, and cracking of the conductive substrates 20a and 20b can also be suppressed due to bending. Furthermore, in the above case, it is easy to reduce the weight and thickness of the photoelectric conversion module 100 as compared with a glass substrate.

The photoelectric conversion elements 10a and 10b may include at least first electrode layers 22a and 22b, second electrode layers 24a and 24b, and photoelectric conversion layers 26a and 26b provided between the first electrode layers 22a and 22b and the second electrode layers 24a and 24b. The photoelectric conversion layers 26a and 26b are layers that contribute to mutual conversion of light energy and electric energy. In a solar cell element that converts light energy into electric energy, the photoelectric conversion layers 26a and 26b may be referred to as light absorption layers.

The first electrode layers 22a and 22b and the second electrode layers 24a and 24b are adjacent to the photoelectric conversion layers 26a and 26b. In the present specification, the term "adjacent" shall mean not only that both layers are in direct contact, but also that both layers are in proximity via another layer.

The first electrode layers 22a and 22b are provided between the photoelectric conversion layers 26a and 26b and the conductive substrates 20a and 20b. The second electrode layers 24a and 24b are located on the side opposite to the conductive substrates 20a and 20b with respect to the photoelectric conversion layers 26a and 26b. Therefore, the photoelectric conversion layers 26a and 26b are located between the first electrode layers 22a and 22b and the second electrode layers 24a and 24b. The first electrode layers 22a and 22b are connected to the conductive substrates 20a and 20b.

In the present embodiment, the second electrode layers 24a and 24b may be constituted by transparent electrode layers. When the second electrode layers 24a and 24b are formed by transparent electrode layers, light incident on the photoelectric conversion layers 26a and 26b or is emitted from the photoelectric conversion layers 26a and 26b passes through the second electrode layers 24a and 24b.

When the second electrode layers 24a and 24b are formed by transparent electrode layers, the first electrode layers 22a and 22b may be formed of opaque electrode layers or may be formed by transparent electrode layers. The first electrode layers 22a and 22b may be formed by, for example, a metal such as molybdenum, titanium, or chromium. Although not particularly limited, the thickness of the first electrode layers 22a and 22b may be, for example, 50 nm to 1500 nm.

In the present embodiment, as a preferred example, the second electrode layers 24a and 24b may be formed by an n-type semiconductor, more specifically, a material having n-type conductivity and relatively low resistance. The second electrode layers 24a and 24b can also function as an n-type semiconductor and a transparent electrode layer. The second electrode layers 24a and 24b include, for example, a metal oxide to which a group III element (B, Al, Ga, or In) is added as a dopant. Examples of the metal oxide include $ZnO$ and $SnO_2$. The second electrode layer 24 can be selected from, for example, indium tin oxide ($In_2O_3$:Sn), indium titanium oxide ($In_2O_3$:Ti), indium zinc oxide ($In_2O_3$:Zn), tin zinc-doped indium oxide ($In_2O_3$:Sn, Zn), tungsten-doped indium oxide ($In_2O_3$:W), hydrogen-doped indium oxide ($In_2O_3$:H), indium gallium zinc oxide ($InGaZnO_4$), zinc tin oxide (ZnO:Sn), fluorine-doped tin oxide ($SnO_2$:F), gallium-doped zinc oxide (ZnO:Ga), boron-doped zinc oxide (ZnO:B), aluminum-doped zinc oxide (ZnO:Al), and the like.

Although not particularly limited, the thickness of the second electrode layers 24a and 24b is, for example, 0.5 μm to 2.5 μm.

The photoelectric conversion layers 26a and 26b may include, for example, a p-type semiconductor. In a specific example, the photoelectric conversion layers 26a and 26b may function as, for example, a polycrystalline or microcrystalline p-type compound semiconductor layer. Although not particularly limited, the thickness of the photoelectric conversion layers 26a and 26b is, for example, 1.0 μm to 3.0 μm.

In a specific example, the photoelectric conversion layers 26a and 26b are formed by a chalcogen semiconductor containing a chalcogen element, and function as a polycrystalline or microcrystalline p-type compound semiconductor layer. The photoelectric conversion layers 26a and 26b may be made of, for example, a group I-III-VI$_2$ compound semiconductor having a chalcopyrite structure containing a group I element, a group III element and a group VI element (chalcogen element). Here, the group I element can be selected from copper (Cu), silver (Ag) gold (Au), and the like. The group III element can be selected from indium (In), gallium (Ga), aluminum (Al) and the like. In addition, the photoelectric conversion layers 26a and 26b may contain tellurium (Te) or the like in addition to selenium (Se) and sulfur(S) as the group VI element. In addition, the photoelectric conversion layers 26a and 26b may contain alkali metals such as Li, Na, K, Rb and Cs.

Alternatively, the photoelectric conversion layers 26a and 26b may be made of a group I$_2$-(II-IV)-VI$_4$ compound semiconductor which is a CZTS-based chalcogen semiconductor containing Cu, Zn, Sn, S or Se. Representative examples of the CZTS-based chalcogen semiconductor include those using a compound such as Cu$_2$ZnSnSe$_4$ or Cu$_2$ZnSn(S,Se)$_4$.

The photoelectric conversion layers 26a and 26b are not limited to those described above, and may be made of any material that causes photoelectric conversion.

The photoelectric conversion elements 10a and 10b may include a first buffer layer (not illustrated) between the photoelectric conversion layers 26a and 26b and the first electrode layers 22a and 22b if necessary. The first buffer layer may be a semiconductor material having the same conductivity type as the first electrode layers 22a and 22b, or may be a semiconductor material having a different conductivity type. The first buffer layer may be made of a material having higher electric resistance than the first electrode layers 22a and 22b.

The first buffer layer is not particularly limited, but may be, for example, a layer containing a chalcogenide compound of a transition metal element having a layered structure. Specifically, the first buffer layer may be made of a compound including a transition metal material such as Mo, W, Ti, V, Cr, Nb or Ta and a chalcogen element such as O, S or Se. The first buffer layer may be, for example, Mo(Se, S)$_2$ layer, MoSe$_2$ layer, MoS$_2$ layer, Cr$_x$TaS$_2$ layer, or the like.

The photoelectric conversion elements 10a and 10b may include a second buffer layer (not illustrated) between the photoelectric conversion layers 26a and 26b and the second electrode layers 24a and 24b if necessary. In this case, the second buffer layer may be a semiconductor material having the same conductivity type as the second electrode layers 24a and 24b, or may be a semiconductor material having a different conductivity type. The second buffer layer may be made of a material having higher electric resistance than the second electrode layers 24a and 24b. The second buffer layer is formed on the photoelectric conversion layers 26a and 26b. Although not particularly limited, the thickness of the second buffer layer is, for example, 10 nm to 100 nm.

The second buffer layer can be selected from compounds containing zinc (Zn), cadmium (Cd) and indium (In). Examples of the compound containing zinc include ZnO, ZnS, Zn (OH)$_2$, or Zn(O,S) and Zn(O,S,OH) which are mixed crystals thereof, and further include ZnMgO and ZnSnO. Examples of the compound containing cadmium include CdS, CdO, or Cd(O,S) and Cd(O,S,OH) which are mixed crystals of CdS and CdO. Examples of the compound containing indium include In$_2$S$_3$ and In$_2$O$_3$, or In$_2$(O,S)$_3$ and In$_2$(O,S,OH)$_3$ which are mixed crystals of In$_2$S$_3$ and In$_2$O$_3$, and In$_2$O$_3$, In$_2$S$_3$, In(OH)$_x$, and the like can be used. The second buffer layer may have a laminated structure of these compounds.

The second buffer layer has an effect of improving characteristics such as photoelectric conversion efficiency, but this can be omitted. When the second buffer layer is omitted, the second electrode layers 24a and 24b are formed directly on the photoelectric conversion layers 26a and 26b.

It should be noted that the laminated structure of the photoelectric conversion elements 10a and 10b is not limited to the above aspect, and may take various aspects. For example, the photoelectric conversion elements 10a and 10b may have a configuration in which both an n-type semiconductor and a p-type semiconductor are sandwiched between the first electrode layer and the second electrode layer. In this case, the second electrode layer may not be made of the n-type semiconductor. In addition, the photoelectric conversion elements 10a and 10b are not limited to the p-n coupling type structure, and may have a p-i-n coupling type structure including an intrinsic semiconductor layer (i-type semiconductor) between an n-type semiconductor and a p-type semiconductor.

The photoelectric conversion elements 10a and 10b include collector electrodes 30a and 30b connected to the second electrode layers 24a and 24b, respectively. The collector electrodes 30a and 30b collect charge carriers from the second electrode layers 24a and 24b, and are formed by a conductive material. The collector electrodes 30a and 30b may be in direct contact with the second electrode layers 24a and 24b. From the viewpoint of securing a power-generatable region, the areas of the collector electrodes 30a and 30b are preferably as small as possible.

The collector electrodes 30a and 30b may have a plurality of substantially linear first portions 31a and 31b and second portions 32a and 32b connected to the plurality of first portions 31a and 31b. The first portions 31a and 31b may be referred to as "fingers". The second portions 32a and 32b may be referred to as "bus bars".

The first portions 31a and 31b are arranged each other at intervals. The first portions 31a and 31b have a function of guiding electric energy (charge carriers) generated in the photoelectric conversion layers 26a and 26b to the second portions 32a and 32b.

In the illustrated aspect, the substantially linear first portions 31a and 31b extend straight along one direction (X direction in the drawing). Alternatively, the first portions 31a and 31b may extend in a wavy line shape or a zigzag polygonal line shape. In the present specification, the term "linear" is defined by a concept including not only a straight line but also an elongated curved line such as a wavy line or a polygonal line.

The plurality of the first portions 31a and 31b of the collector electrodes 30a and 30b may be provided side by side in a first direction (Y direction in the drawing). The plurality of linear first portions 31a and 31b may be connected to the same second portions 32a and 32b. The plurality of first portions 31a and 31b may be provided on one side with respect to the second portions 32a and 32b.

The second portions 32a and 32b of the collector electrodes 30a and 30b may extend along the first direction (Y direction in the drawing). The second portions 32a and 32b may be connected to the first portions 31a and 31b at the end portions of the first portions 31a and 31b. In this case, the plurality of first portions 31a and 31b may extend from the second portions 32a and 32b along a second direction (X direction in the drawing).

The second portions 32a and 32b of the collector electrodes 30a and 30b may extend substantially from the vicinity of one end to the vicinity of the other end of the photoelectric conversion elements 10a and 10b in the first direction (Y direction in the drawing). A width W1 (width in the X direction in the drawing) of the second portions 32a and 32b of the collector electrodes 30a and 30b may be larger than the width (width in the Y direction in the drawing) of the first portions 31a and 31b.

The collector electrodes 30a and 30b (first portions 31a and 31b and second portions 32a and 32b) may be made of a material having higher conductivity than the material constituting the second electrode layers 24a and 24b. As a material constituting the collector electrodes 30a and 30b (first portions 31a and 31b and second portions 32a and 32b), a material having good conductivity and capable of obtaining high adhesion to the second electrode layers 24a and 24b is applied. For example, the material constituting the collector electrodes 30a and 30b can be selected from at least one of indium tin oxide (In$_2$O$_3$:Sn), indium titanium oxide (In$_2$O$_3$:Ti), indium zinc oxide (In$_2$O$_3$:Zn), tin zinc-doped indium oxide (In$_2$O$_3$:Sn,Zn), tungsten-doped indium oxide (In$_2$O$_3$:W), hydrogen-doped indium oxide (In$_2$O$_3$:H), indium gallium zinc oxide (InGaZnO$_4$), zinc tin oxide (ZnO:Sn), fluorine-doped tin oxide (SnO$_2$:F), aluminum-doped zinc oxide (ZnO:Al), boron-doped zinc oxide (ZnO: B), gallium-doped zinc oxide (ZnO:Ga), Ni, Ti, Cr, Mo, Al, Ag, and Cu, or a compound containing one or more of these. The collector electrodes 30a and 30b may be made of an alloy or a laminate made of a combination of the above-described materials.

The second portions 32a and 32b of the collector electrodes 30a and 30b are provided near one end portions of the photoelectric conversion elements 10a and 10b in plan view as viewed from a direction orthogonal to the photoelectric conversion surface (see FIG. 3). The second portions 32a and 32b of the collector electrodes 30a and 30b extend in the Y direction in the drawing along one end portion of the photoelectric conversion elements 10a and 10b at the one end portion.

The photoelectric conversion elements 10a and 10b may have insulating materials 50a and 50b provided on the conductive substrates 20 and 20b. The insulating materials 50a and 50b are provided on the back surfaces of the conductive substrates 20 and 20b, that is, one surface on the opposite side to the side where each layer contributing to photoelectric conversion is formed. The insulating materials 50a and 50b are provided to suppress a short circuit between the photoelectric conversion elements 10a and 10b adjacent to each other. The regions where the insulating materials 50a and 50b are provided will be described later.

The insulating materials 50a and 50b may be made by, for example, an insulating tape. In this case, the insulating tape may be attached to a region described later of the conductive substrates 20a and 20b.

Alternatively, the material constituting the insulating materials 50a and 50b may include at least one selected from the group including Al$_2$O$_3$, Y$_2$O$_3$, ZrO$_2$, MgO, HfO$_2$, Bi$_2$O$_3$, TiO$_2$, Zno, In$_2$O$_3$, SnO$_2$, Nb$_2$O$_5$, Ta$_2$O$_5$, SiO$_2$ and Ca$_3$(PO$_4$)$_2$. In this case, the insulating materials 50a and 50b can be formed by a known deposition technique such as chemical vapor deposition.

In addition, the insulating materials 50a and 50b may be single insulating layers made of one material, or may be a laminate including layers made of a plurality of materials.

Next, a structure related to connection between the photoelectric conversion elements 10a and 10b will be described. Hereinafter, one of the photoelectric conversion elements 10a and 10b adjacent to each other may be referred to as a "first photoelectric conversion element", and the other of the photoelectric conversion elements 10a and 10b adjacent to each other may be referred to as a "second photoelectric conversion element". In the illustrated aspect, among the two photoelectric conversion elements adjacent to each other, the photoelectric conversion element 10a on the left side in the drawing is referred to as the "first photoelectric conversion element", and the photoelectric conversion element 10b on the right side in the drawing is referred to as the "second photoelectric conversion element". However, it should be noted that the terms the "first photoelectric conversion element" and the "second photoelectric conversion element" are merely used for convenience to distinguish the elements. Each of the first photoelectric conversion element and the second photoelectric conversion element may have the structure of the photoelectric conversion elements 10a and 10b described above. Therefore, the first photoelectric conversion element and the second photoelectric conversion element may be elements having the same structure.

The conductive substrate 20b of the second photoelectric conversion element 10b is disposed so as to overlap a part of the collector electrode 30a of the first photoelectric conversion element 10a (see FIGS. 1 and 2). Specifically, the conductive substrate 20b of the second photoelectric conversion element 10b may cover at least a part of the second portion 31a of the collector electrode 30a of the first photoelectric conversion element 10a when viewed from the height direction. As a result, a part of the conductive substrate 20b of the second photoelectric conversion element 10b is electrically connected to the first photoelectric conversion element 10a, for example, the second portion 31a of the collector electrode 30a via the conductor 200. Here, in the present specification, the height direction is a direction intersecting each film constituting the photoelectric conversion elements 10a and 10b, and corresponds to the Z direction in the drawing.

The second photoelectric conversion element 10b preferably does not cover the first portion 31a of the collector electrode 30a of the first photoelectric conversion element 10a. As a result, the region of the first photoelectric conversion element 10a exposed from the second photoelectric conversion element 10b increases, so that a wide region where photoelectric conversion can be performed by the first photoelectric conversion element 10a can be secured. Therefore, the photoelectric conversion efficiency of the entire photoelectric conversion module 100 can be improved.

The second photoelectric conversion element 10b covers at least a part, preferably the entire second portion 32a of the collector electrode 30a of the first photoelectric conversion element 10a. More preferably, the second photoelectric conversion element 10b is disposed so as to substantially not cover the first portion 31a while substantially entirely covering the second portion 32a of the collector electrode 30a of the first photoelectric conversion element 10a. As a result, the first photoelectric conversion element 10a and the second photoelectric conversion element 10b can be densely arranged such that a region that does not contribute to photoelectric conversion, that is, a region of the second portion 32a is not exposed. Therefore, the size of the photoelectric conversion module as a whole can be reduced without reducing the efficiency of photoelectric conversion.

The insulating material 50*b* provided on the conductive substrate 20*b* of the second photoelectric conversion element 10*b* separates the conductive substrate 20*b* of the second photoelectric conversion element 10*b* from the conductive substrate 20*a* of the first photoelectric conversion element 10*a*. More preferably, the insulating material 50*b* provided on the conductive substrate 20*b* of the second photoelectric conversion element 10*b* separates the conductive substrate 20*b* of the second photoelectric conversion element 10*b* from the first electrode layer 22*a* of the first photoelectric conversion element 10*a*.

In the first embodiment, the sizes (areas) of the conductive substrates 20*a* and 20*b* and the first electrode layers 22*a* and 22*b* are larger than the sizes (areas) of the photoelectric conversion layers 26*a* and 26*b* and the second electrode layers 24*a* and 24*b*. Therefore, at least one of the conductive substrate 20*a* and the first electrode layer 22*a* of the first photoelectric conversion element 10*a* extends to the outside of the second electrode layer 24*a* and the photoelectric conversion layer 26*a* when viewed from the height direction. In this case, the insulating material 50*b* preferably overlaps at least a part of a region of the conductive substrate 20*a* of the first photoelectric conversion element 10*a* and the first electrode layer 22*a* extending to the outside of the second electrode layer 24*a* and the photoelectric conversion layer 26*a* when viewed from the height direction.

Specifically, in the first embodiment, the insulating materials 50*a* and 50*b* are formed in a band shape in a direction (Y direction) intersecting the direction (X direction) in which the first photoelectric conversion element 10*a* and the second photoelectric conversion element 10*b* are arranged. Specifically, the insulating materials 50*a* and 50*b* preferably extend from one end to the other end of the conductive substrates 20*a* and 20*b* in the Y direction.

Portions of the conductive substrates 20*a* and 20*b* are exposed from the insulating materials 50*a* and 50*b* for electrical connection with other photoelectric conversion elements. In the illustrated aspect, regarding the band-shaped insulating materials 50*a* and 50*b* of the conductive substrates 20*a* and 20*b*, both sides in the direction (X direction) in which the first photoelectric conversion element 10*a* and the second photoelectric conversion element 10*b* are arranged are exposed. Alternatively, the band-shaped insulating materials 50*a* and 50*b* of the conductive substrates 20*a* and 20*b* may be exposed only on one side in the direction (X direction) in which the first photoelectric conversion element 10*a* and the second photoelectric conversion element 10*b* are arranged. In other words, the insulating materials 50*a* and 50*b* may reach one ends of the conductive substrates 20*a* and 20*b* in the X direction.

Figure 5:
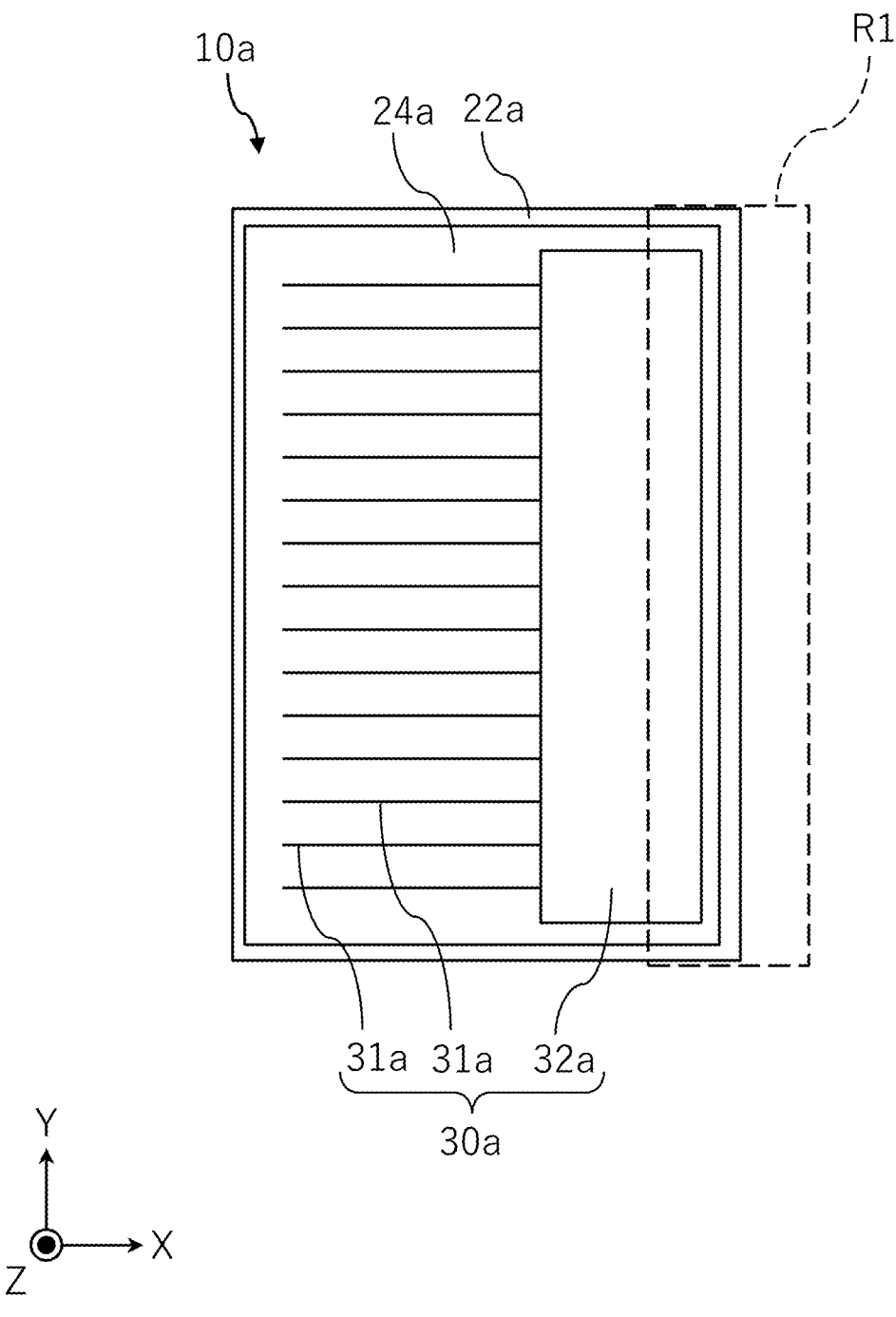
FIG. 5 is a schematic view for explaining a region of a first photoelectric conversion element covered with an insulating material of a second photoelectric conversion element.

FIG. 5 is a schematic view for explaining a region R1 of the first photoelectric conversion element 10*a* covered with the insulating material 50*b* of the second photoelectric conversion element 10*b*. In FIG. 5, the region R1 is slightly longer than the length of the first photoelectric conversion element 10*a* in the Y direction for convenience of description, but the region R1 may be substantially the same as the length of the first photoelectric conversion element 10*a* in the Y direction. As illustrated in FIG. 5, the insulating material 50*b* of the second photoelectric conversion element 10*b* overlaps a region of the conductive substrate 20*a* of the first photoelectric conversion element 10*a* and the first electrode layer 22*a* extending to the outside of the second electrode layer 24*a* and the photoelectric conversion layer 26*a* at one end portion in the direction in which the first photoelectric conversion element 10*a* and the second photoelectric conversion element 10*b* are arranged. Thus, the conductive substrate 20*b* of the second photoelectric conversion element 10*b* can be prevented from electrically contacting the first electrode layer 22*a* and/or the conductive substrate 20*a* of the first photoelectric conversion element 10*a*. Therefore, an electrical short circuit between the first photoelectric conversion element 10*a* and the second photoelectric conversion element 10*b* can be suppressed.

In addition, the insulating material 50*b* of the second photoelectric conversion element 10*b* is preferably provided in a region of the first photoelectric conversion element 10*a* covered with the second photoelectric conversion element 10*b* so as to straddle at least one edge of the conductive substrate 20*a* of the first photoelectric conversion element 10*a* and the first electrode layer 22*a* when viewed from the height direction. In FIG. 5, the insulating material 50*b* of the second photoelectric conversion element 10 is provided across the edges of the conductive substrate 20*a* and the first electrode layer 22*a* of the first photoelectric conversion element 10*a* at one end portion in the direction in which the first photoelectric conversion element 10*a* and the second photoelectric conversion element 10*b* are arranged.

The edges of the conductive substrate 20*a* and the first electrode layer 22*a* of the first photoelectric conversion element 10*a* are exposed from the photoelectric conversion layer 26*a* and the second electrode layer 24*a* on the side surface of the photoelectric conversion element 10*a*. When the insulating material 50*b* of the second photoelectric conversion element 10 is provided across the edge between the conductive substrate 20*a* of the first photoelectric conversion element 10*a* and the first electrode layer 22*a*, an electrical short circuit between the first photoelectric conversion element 10*a* and the second photoelectric conversion element 10*b* can be further suppressed.

In the illustrated aspect, the sizes (areas) of the conductive substrate 20*a* and the first electrode layer 22*a* are larger than the sizes (areas) of the photoelectric conversion layer 26*a* and the second electrode layer 24*a*. Instead of the illustrated aspect, the sizes (areas) of the conductive substrate 20*a* and the first electrode layer 22*a* may be substantially the same as the sizes (areas) of the photoelectric conversion layer 26*a* and the second electrode layer 24*a*. In this case, the insulating material 50*b* of the second photoelectric conversion element 10*b* is a region of the first photoelectric conversion element 10*a* covered with the second photoelectric conversion element 10*b* when viewed from the height direction, and may be provided so as to straddle at least one, preferably both, edges of the conductive substrate 20*a* and the first electrode layer 22*a* of the first photoelectric conversion element 10*a* when viewed from the height direction. Even in this case, since the insulating material 50*b* of the second photoelectric conversion element 10*b* covers the conductive substrate 20*a* and/or the first electrode layer 22*a* of the first photoelectric conversion element 10*a*, a short circuit can be prevented.

Furthermore, the insulating material 50*b* of the second photoelectric conversion element 10*b* is preferably provided so as to cover a region of the photoelectric conversion layer 26*a* of the first photoelectric conversion element 10*a* exposed from the second electrode layer 24*a* and/or so as to straddle an edge of the photoelectric conversion layer 26*a*. Thus, the conductive substrate 20*b* of the second photoelectric conversion element 10*b* can be prevented from electrically contacting the photoelectric conversion layer 26*a* of the first photoelectric conversion element 10*a*. Therefore, an electrical short circuit between the first photoelectric conversion element 10*a* and the second photoelectric conversion element 10*b* can be suppressed.

The conductive substrate 20*b* of the second photoelectric conversion element 10*b* may be a flexible substrate as described above. In this case, the conductive substrate 20*b* of the second photoelectric conversion element 10*b* may be curved. Specifically, the flexible substrate 20*b* of the second photoelectric conversion element 10*b* may have a first end portion connected to the conductor 200 and a second end portion opposite to the first end portion, and the substrate 20*b* may be curved in the height direction between the first end portion and the second end portion.

That is, the flexible substrate 20*b* of the second photoelectric conversion element 10*b* is preferably curved such that the position of the first end portion of the flexible substrate 20*b* in the height direction (Z direction in the drawing) is shifted from the position of the second end portion of the flexible substrate 20*b* in the height direction, and the first end portion is substantially parallel to the second end portion. As a result, both ends of the substrate 20*b* are substantially parallel in the X direction in the drawing, and are not inclined obliquely with respect to the surface of the stage holding the photoelectric conversion module, for example. As a result, the photoelectric conversion elements 10*a* and 10*b* adjacent to each other can be bonded to the conductor 200 with a uniform force, and a decrease in adhesive force can be suppressed.

The configurations of the connection portions of the two photoelectric conversion elements 10*a* and 10*b* adjacent to each other and the vicinity thereof have been described above. The configuration related to the connection may be applied between arbitrary photoelectric conversion elements 10*a* and 10*b* adjacent to each other.

The photoelectric conversion module 100 including the plurality of photoelectric conversion elements 10*a* and 10*b* may have a sealing material (not illustrated). The sealing material may be provided to seal the whole of the plurality of photoelectric conversion elements 10*a* and 10*b* or a side of the conductive substrates 20*a* and 20*b* of the plurality of photoelectric conversion elements 10*a* and 10*b* having the above-described configuration.

Second Embodiment

Figure 6:
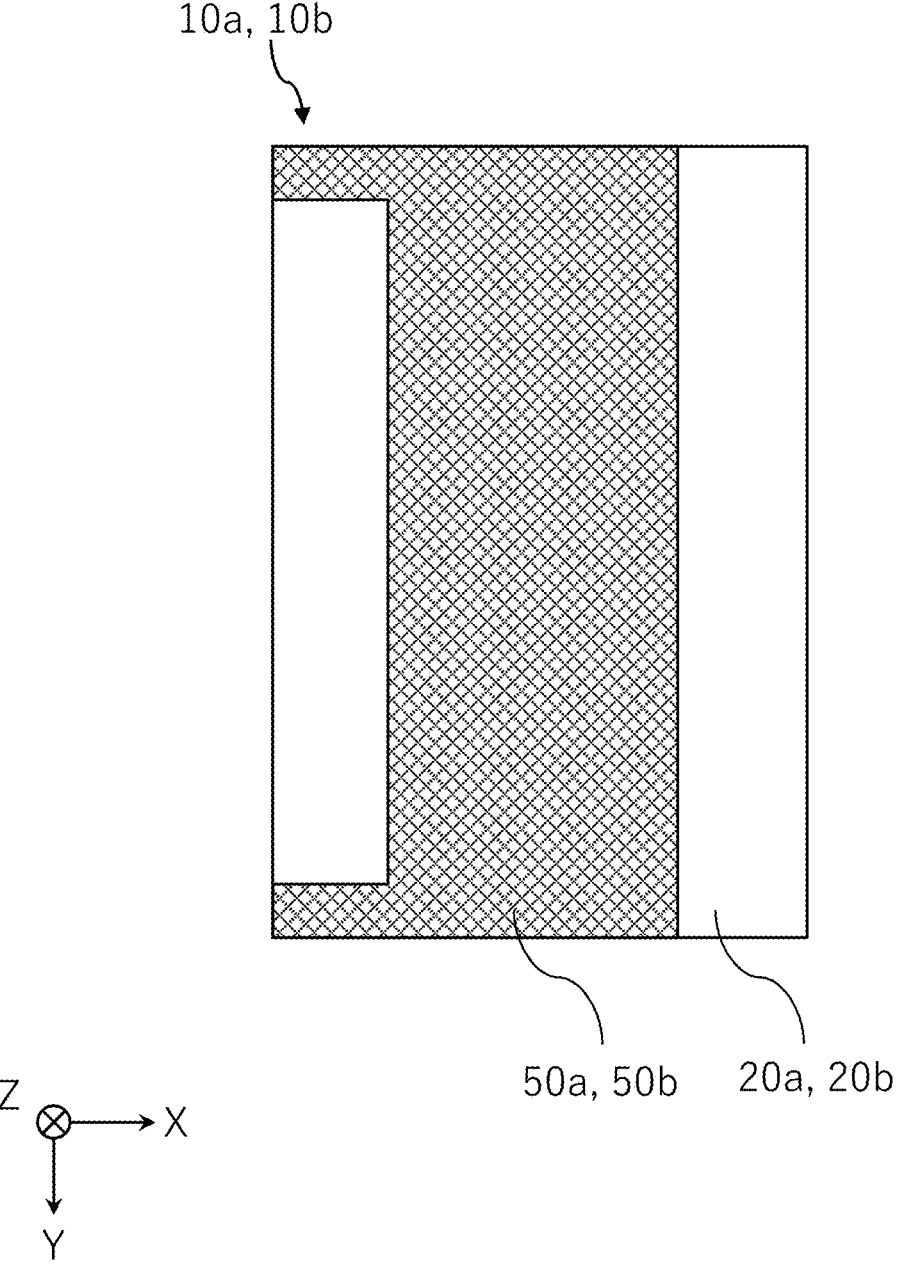
FIG. 6 is a schematic rear view of each photoelectric conversion element constituting the photoelectric conversion module according to the second embodiment.
Figure 7:
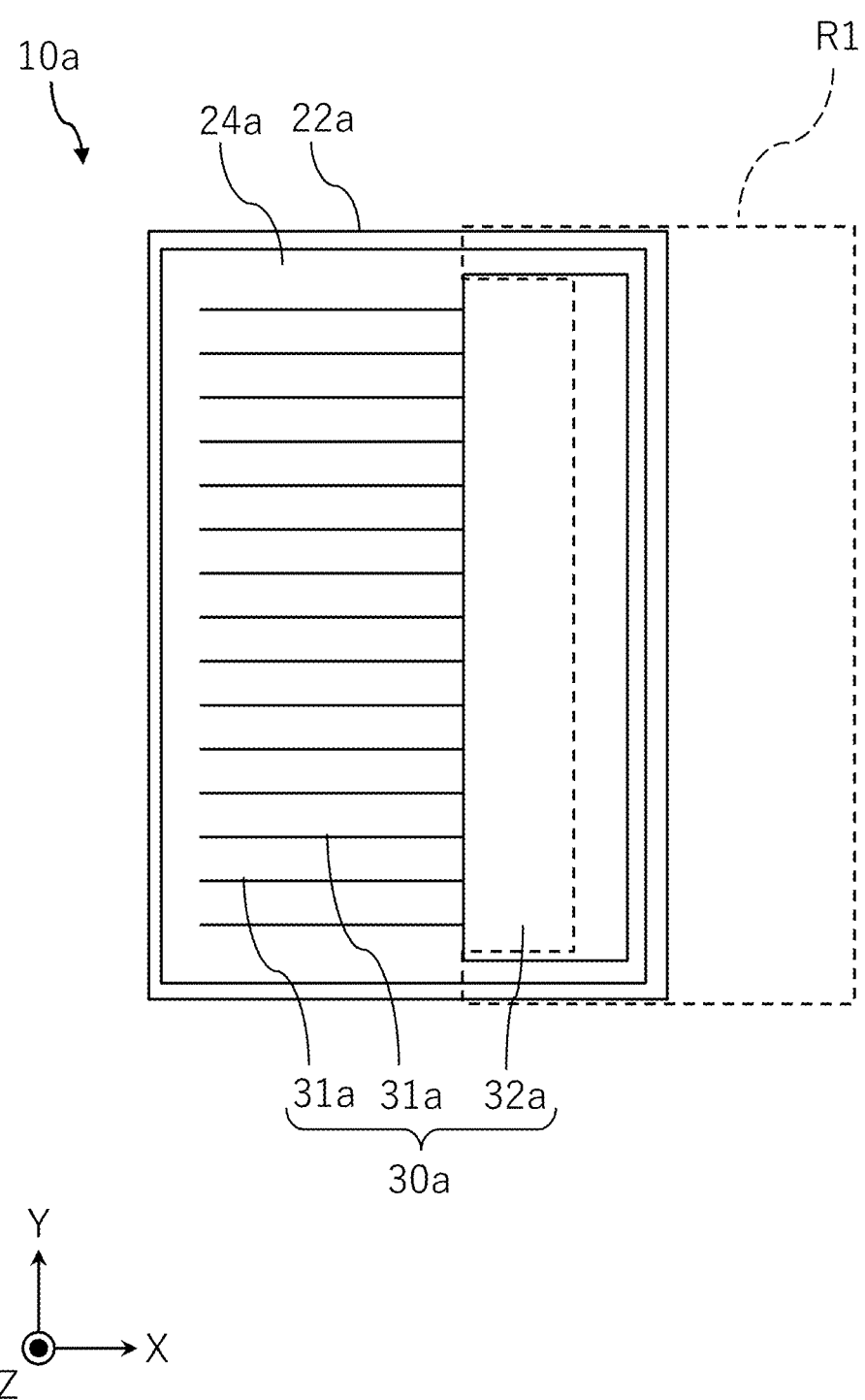
FIG. 7 is a schematic view for explaining a region of a first photoelectric conversion element covered with an insulating material of a second photoelectric conversion element according to the second embodiment.

Next, a photoelectric conversion module according to a second embodiment will be described with reference to FIGS. 6 and 7. FIG. 6 is a schematic rear view of each photoelectric conversion element constituting the photoelectric conversion module according to the second embodiment. FIG. 7 is a schematic view for explaining a region covered with an insulating material of the second photoelectric conversion element in the first photoelectric conversion element according to the second embodiment. Note that, in FIG. 7, the region R1 is described to be slightly longer than the length of the first photoelectric conversion element 10*a* in the Y direction for convenience of description, but the region R1 may be substantially the same as the length of the first photoelectric conversion element 10*a* in the Y direction.

The second embodiment is different from the first embodiment in a region where the insulating materials 50*a* and 50*b* are formed. In the second embodiment, the insulating materials 50*a* and 50*b* of the photoelectric conversion elements 10*a* and 10*b* are provided in a U-shape on the back surface sides of the conductive substrates 20*a* and 20*b*. The insulating material 50*b* of the second photoelectric conversion element 10*b* has a U-shape defined by a region covered with the second photoelectric conversion element 10*b* in the end portion of the first photoelectric conversion element 10*a*.

Specifically, the region R1 of the insulating material 50*b* of the second photoelectric conversion element 10*b* overlaps the entire region extending to the outside of the second electrode layer 24*a* and the photoelectric conversion layer 26*a* in the conductive substrate 20*a* and the first electrode layer 22*a* of the first photoelectric conversion element 10*a* when viewed from the height direction. Alternatively, the region R1 of the insulating material 50*b* of the second photoelectric conversion element 10*b* is a region covered with the second photoelectric conversion element 10*b*, and is provided so as to straddle the entire edge of at least one of the conductive substrate 20*a* and the first electrode layer 22*a* of the first photoelectric conversion element 10*a* when viewed from the height direction. This makes it possible to more reliably prevent a short circuit from occurring between the first photoelectric conversion element 10*a* and the second photoelectric conversion element 10*b*.

Furthermore, the insulating material 50*b* of the second photoelectric conversion element 10*b* is preferably provided so as to cover the entire region exposed from the second electrode layer 24*a* in the photoelectric conversion layer 26*a* of the first photoelectric conversion element 10*a*, which is a region covered by the second photoelectric conversion element 10*b*, and/or so as to straddle the edge of the photoelectric conversion layer 26*a* in the region covered by the second photoelectric conversion element 10*b*. Thus, the conductive substrate 20*b* of the second photoelectric conversion element 10*b* can be prevented from electrically contacting the photoelectric conversion layer 26*a* of the first photoelectric conversion element 10*a*.

Also in the second embodiment, although not essential, the conductive substrate 20*b* of the second photoelectric conversion element 10*b* may be connected to the second portion 32*a* of the collector electrode 30*a* of the first photoelectric conversion element 10*a* via the conductor 200. In this case, the insulating material 50*b* of the second photoelectric conversion element 10*b* may cover a region covered with the second photoelectric conversion element 10*b* in a region around the second portion 32*a* of the collector electrode 30*a*. As a result, the region around the second portion 32*a* of the collector electrode 30*a* is covered with the insulating material 50*b* of the second photoelectric conversion element 10*b*, so that the possibility of electrical short circuit can be further suppressed.

[Method for Manufacturing Photoelectric Conversion Module]

A method for manufacturing a photoelectric conversion module according to an embodiment will be described. First, the first photoelectric conversion element 10*a* including the conductive substrate 20*a* and the second photoelectric conversion element 10*b* including the conductive substrate 20*b* and including the insulating material 50*b* provided on the conductive substrate 20*b* are prepared. Specifically, the first photoelectric conversion element 10*a* and the second photoelectric conversion element 10*b* may have the structures of any of the photoelectric conversion elements 10*a* and 10*b* described in the above-described embodiment.

In the manufacturing process of each of the photoelectric conversion elements 10*a* and 10*b*, the first electrode layers 22*a* and 22*b*, the first buffer layer, the photoelectric conversion layers 26*a* and 26*b*, the second buffer layer, and the second electrode layers 24*a* and 24*b* are formed on the conductive substrates 20*a* and 20*b*. In addition, if necessary, a metal material such as molybdenum, titanium or chromium may be formed on the back side of the conductive substrates 20a and 20b in order to prevent warpage. The first buffer layer and the second buffer layer may be formed if necessary.

The first electrode layers 22a and 22b are formed by depositing a material constituting the first electrode layers 22a and 22b on the surfaces of the conductive substrates 20a and 20b, for example, by a sputtering method. The materials constituting the first electrode layers 22a and 22b are as described above. The sputtering method may be a direct current (DC) sputtering method or a radio frequency (RF) sputtering method. In addition, the first electrode layers 22a and 22b may be formed using a chemical vapor deposition (CVD) method, an atomic layer deposition (ALD) method, or the like instead of the sputtering method.

The photoelectric conversion layers 26a and 26b are formed on the first electrode layers 22a and 22b by deposition. In a specific example, the photoelectric conversion layers 26a and 26b are formed, for example, by forming a thin film precursor layer on the first electrode layers 22a and 22b and by chalcogenizing the precursor layer.

The second buffer layer is formed on the photoelectric conversion layer 26 by a method such as a chemical bath deposition (CBD) method, a sputtering method, a CVD method or an ALD method. The material constituting the second buffer layer is as described above.

The second electrode layers 24a and 24b are formed on the second buffer layer by a method such as a sputtering method, a CVD method or an ALD method. Alternatively, when the second buffer layer is not present, the second electrode layers 24a and 24b are formed on the photoelectric conversion layers 26a and 26b. The materials constituting the second electrode layers 24a and 24b are as described above.

Next, collector electrodes 30a and 30b (first portions 31a and 31b and second portions 32a and 32b) are formed on the second electrode layers 24a and 24b. The collector electrodes 30a and 30b can be formed, for example, by applying a printing process such as an inkjet method or a screen printing method in addition to a sputtering method, a CVD method, an ALD method, an AD method, and a vapor deposition method.

Next, if necessary, insulating materials 50a and 50b are formed on the conductive substrates 20a and 20b of the photoelectric conversion elements 10a and 10b, respectively. The insulating materials 50a and 50b are provided at the desired positions described above by a known vapor deposition method or the like. When the insulating materials 50a and 50b are insulating tapes, the insulating materials 50a and 50b may be attached to desired portions of the conductive substrates 20a and 20b. The first photoelectric conversion element 10a and the second photoelectric conversion element 10b can be manufactured by the above-described series of steps. The region where the insulating materials 50a and 50b are provided is as described in each of the above embodiments.

Next, a connection step of electrically connecting a part of the conductive substrate 20a of the second photoelectric conversion element 10b to the first photoelectric conversion element 10a is performed. The electrical connection is performed by the conductor 200 such as solder or conductive paste. The connection step includes disposing a part of the conductive substrate 20b of the second photoelectric conversion element 10b to be electrically connected to the first photoelectric conversion element 10a while the insulating material 50b of the second photoelectric conversion element 10b separate the conductive substrate 20b of the second photoelectric conversion element 10b from the conductive substrate 20a of the first photoelectric conversion element 10a. Preferably, the part of the conductive substrate 20b of the second photoelectric conversion element 10b may be electrically connected to the second portion 32a of the collector electrode 30a of the first photoelectric conversion element 10a. As a result, the second photoelectric conversion element 10b can be connected onto the first photoelectric conversion element 10a via the conductor 200.

By repeating the above connection step, a large number of photoelectric conversion elements can be arranged side by side.

Third Embodiment

Figure 8:
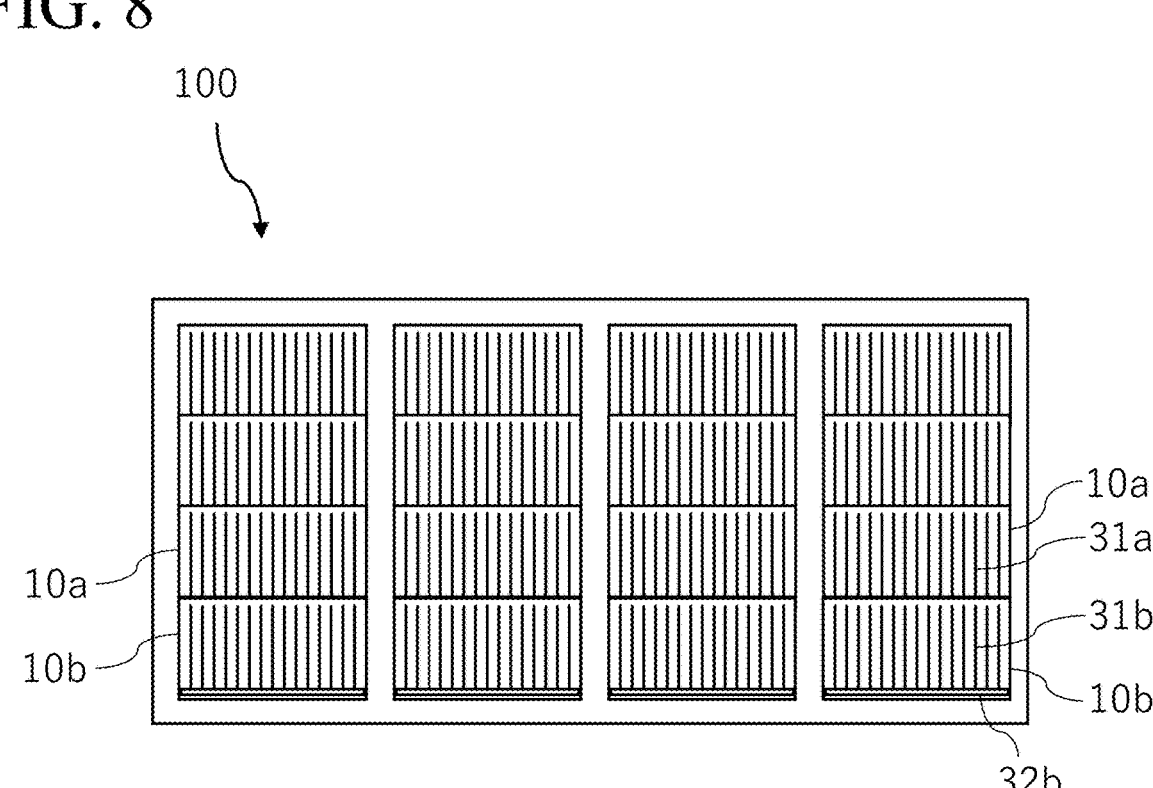
FIG. 8 is a schematic plan view of a photoelectric conversion module according to a third embodiment.

Next, a photoelectric conversion module according to a third embodiment will be described with reference to FIG. 8. FIG. 8 is a schematic plan view of a photoelectric conversion module according to the third embodiment. The same reference numerals are given to the same configurations as those of the first embodiment. It should be noted that the description of the same configuration as that of the first embodiment may be omitted.

The photoelectric conversion module 100 may include one or a plurality of photoelectric conversion elements 10a and 10b. Note that FIG. 8 illustrates the photoelectric conversion module 100 including the plurality of photoelectric conversion elements 10a and 10b. The one or more photoelectric conversion elements 10a and 10b may be sealed with, for example, a sealing material.

When the photoelectric conversion module 100 includes the plurality of photoelectric conversion elements 10a and 10b, the plurality of photoelectric conversion elements 10a and 10b may be arranged in at least one direction, and preferably may be arranged in a lattice pattern. In this case, the plurality of photoelectric conversion elements 10a and 10b may be electrically connected to each other in series and/or in parallel.

In the example illustrated in FIG. 8, the photoelectric conversion elements 10a and 10b are arranged so as to partially overlap each other. Among the photoelectric conversion elements 10a and 10b arranged in one direction, adjacent photoelectric conversion elements partially overlap each other. Specifically, as illustrated in FIG. 8, the second photoelectric conversion element 10b may be disposed so as to cover the second portion 32a of the collector electrode 30a of the first photoelectric conversion element 10a adjacent thereto. In this case, the second photoelectric conversion element 10b is electrically connected to the second portion 32a of the collector electrode 30a of the first photoelectric conversion element 10a adjacent thereto.

[Artificial Satellite and Paddle for Artificial Satellite]

Figure 9:
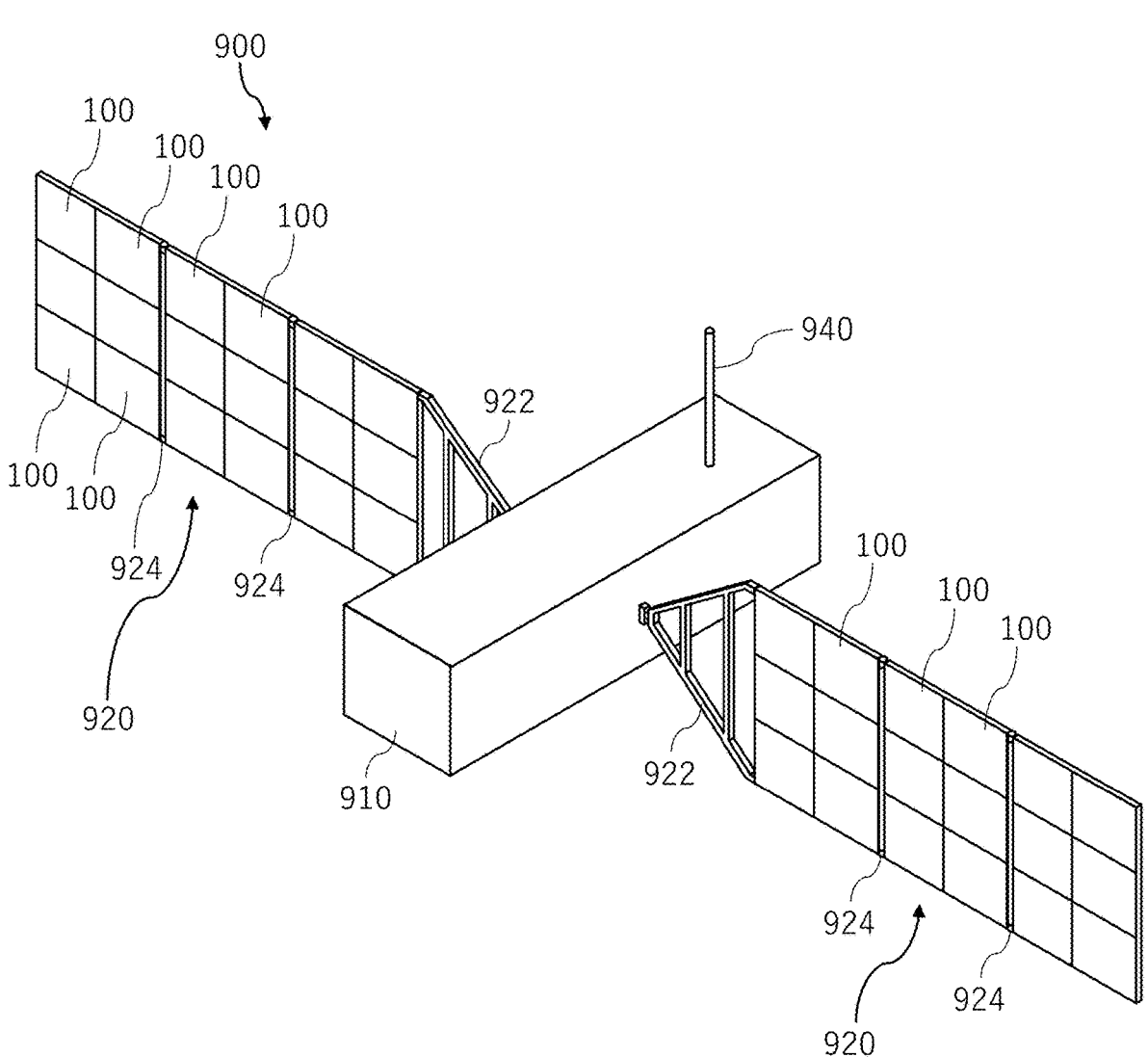
FIG. 9 is a schematic perspective view of an artificial satellite including a photoelectric conversion module.

Next, an artificial satellite including a photoelectric conversion module and a paddle for an artificial satellite will be described. FIG. 9 is a schematic perspective view of an artificial satellite including a photoelectric conversion module. An artificial satellite 900 may have a base portion 910 and a paddle 920. The base portion 910 may include a device (not illustrated) necessary for controlling the artificial satellite 900 and the like. An antenna 940 may be attached to the base portion 910.

The paddle 920 may include the photoelectric conversion module 100 described above. The paddle 920 including the photoelectric conversion module 100 can be used as a power source for operating various devices provided in the base portion 910. As described above, the photoelectric conversion module 100 can be applied to a paddle for an artificial satellite. In particular, since the paddle 920 for an artificial satellite is exposed to a high temperature environment and a severe temperature change environment at the time of launching and operating the artificial satellite, it is desirable to use the photoelectric conversion module 100 including the photoelectric conversion element 10 having high heat resistance described above.

The paddle 920 may include a connecting portion 922 and a hinge portion 924. The connecting portion 922 corresponds to a portion connecting the paddle 920 to the base portion 910.

The hinge portion 924 extends along one direction, and the paddle 920 can be bent with the hinge portion 924 as a rotation axis. Each paddle 920 may have at least one, preferably a plurality of, hinge portions 924. Thus, the paddle 920 including the photoelectric conversion module 100 is configured to be small and foldable. When the artificial satellite 900 is launched, the paddle 920 may be in a folded state. The paddle 920 may be deployed when receiving sunlight to generate power.

Instead of the structure as illustrated in FIG. 9, the paddle 920 may have a cylindrical shape formed by being wound. Accordingly, the paddle 920 can take a substantially flat developed state by the rotation of the wound portion. When the artificial satellite 900 is launched, the paddle 920 may maintain a generally cylindrical shape. The paddle 920 may be unfolded in a substantially flat state when receiving sunlight to generate power.

As described above, the contents of the present invention have been disclosed through the embodiments, but it should not be understood that the description and the drawings constituting a part of the disclosure limit the present invention. From this disclosure, various alternative embodiments, examples, and operational techniques will become apparent to those skilled in the art. Therefore, the technical scope of the present invention is defined only by the matters specifying the invention according to the claims appropriate from the above description.

Each feature described in each of the foregoing embodiments may be applied to or replaced with another embodiment as much as possible. In the above embodiment, the thin-film photoelectric conversion element has been described as an example, but the present invention is not limited thereto, and can be applied to a crystalline photoelectric conversion element as much as possible.

In the embodiment described above, the conductive substrate 20*b* of the second photoelectric conversion element 10*b* is electrically connected to the second portion 32*a* of the collector electrode 30*a* of the first photoelectric conversion element 10*a*. Alternatively, the conductive substrate 20*b* of the second photoelectric conversion element 10*b* may be electrically connected to the second electrode layer 24*a* of the first photoelectric conversion element 10*a* via the conductor 200 or directly.

The invention claimed is:

1. A photoelectric conversion module comprising:
   a first photoelectric conversion element including a first conductive substrate;
   a second photoelectric conversion element including a second conductive substrate, and
   a conductor electrically connecting a part of the second conductive substrate of the second photoelectric conversion element to the first photoelectric conversion element, wherein the first photoelectric conversion element comprises:
   a first electrode layer connected to the first conductive substrate of the first photoelectric conversion element;
   a second electrode layer; and
   a photoelectric conversion layer between the first electrode layer and the second electrode layer,
the first photoelectric conversion element and the second photoelectric conversion element are arranged side by side so as to partially overlap each other,
an insulating material that separates the second conductive substrate of the second photoelectric conversion element from the first conductive substrate of the first photoelectric conversion element and is adhered to the second conductive substrate of the second photoelectric conversion element,
the insulating material does not adhere to the first photoelectric conversion element, and
when viewed in a cross section, a thickness of the insulating material is smaller than a distance between the second electrode layer of the first photoelectric conversion element and the second conductive substrate at a position where the conductor is provided wherein at least one of the first conductive substrate and the first electrode layer of the first photoelectric conversion element extends outside the second electrode layer and the photoelectric conversion layer when viewed from a height direction, and when viewed from the height direction, the insulating material overlaps at least a part of a region where at least one of the first conductive substrate and the first electrode layer in the first photoelectric conversion element extends outside the second electrode layer and the photoelectric conversion layer.

2. The photoelectric conversion module according to claim 1, wherein
   the insulating material is provided in a region covered with the second photoelectric conversion element so as to straddle at least one edge of the first conductive substrate and the first electrode layer in the first photoelectric conversion element when viewed from a height direction.

3. The photoelectric conversion module according to claim 1, wherein
   the insulating material is provided so as to cover a region of the photoelectric conversion layer exposed from the second electrode layer and/or so as to straddle an edge of the photoelectric conversion layer.

4. The photoelectric conversion module according to claim 1, wherein the insulating material has a U-shape defined by a region which is an end portion of the first photoelectric conversion element and which is covered with the second photoelectric conversion element.

5. The photoelectric conversion module according to claim 1, wherein the first photoelectric conversion element includes a collector electrode,
   the collector electrode includes a plurality of substantially linear first portions and a second portion connected to the plurality of first portions, and
   the second portion of the collector electrode of the first photoelectric conversion element is connected to the second conductive substrate of the second photoelectric conversion element.

6. The photoelectric conversion module according to claim 5, wherein the insulating material covers a region which is covered with the second photoelectric conversion element and which is a region around the second portion of the collector electrode.

7. The photoelectric conversion module according to claim 1, wherein the insulating material is formed by an insulating tape.

8. The photoelectric conversion module according to claim 1, wherein the insulating material includes at least one selected from the group including $Al_2O_3$, $Y_2O_3$, $ZrO_2$, $MgO$, $HfO_2$, $Bi_2O_3$, $TiO_2$, $ZnO$, $In_2O_3$, $SnO_2$, $Nb_2O_5$, $Ta_2O_5$, $SiO_2$, and $Ca_3(PO_4)_2$.

9. A method for manufacturing a photoelectric conversion module, the method comprising:

a step of preparing a first photoelectric conversion element including a first conductive substrate and a second photoelectric conversion element including a second conductive substrate and an insulating material adhered to the second conductive substrate; and a connecting step of electrically connecting a part of the second conductive substrate of the second photoelectric conversion element to the first photoelectric conversion element, wherein the first photoelectric conversion element comprises:

a first electrode layer connected to the first conductive substrate of the first photoelectric conversion element;

a second electrode layer; and a photoelectric conversion layer between the first electrode layer and the second electrode layer, the connecting step includes arranging a part of the second conductive substrate of the second photoelectric conversion element to be electrically connected to the first photoelectric conversion element by a conductor while the insulating material separates the second conductive substrate of the second photoelectric conversion element from the first conductive substrate of the first photoelectric conversion element without adhering to the first photoelectric conversion element, and when viewed in a cross section, a thickness of the insulating material is smaller than a distance between the second electrode layer of the first photoelectric conversion element and the second conductive substrate at a position where the conductor is provided wherein at least one of the first conductive substrate and the first electrode layer of the first photoelectric conversion element extends outside the second electrode layer and the photoelectric conversion layer when viewed from a height direction, and when viewed from the height direction, the insulating material overlaps at least a part of a region where at least one of the first conductive substrate and the first electrode layer in the first photoelectric conversion element extends outside the second electrode layer and the photoelectric conversion layer.

10. A paddle comprising the photoelectric conversion module according to claim 1.

11. The photoelectric conversion module according to claim 1, wherein the thickness of the insulating material is smaller than a thickness of the conductor in a height direction.

* * * * *